(12) United States Patent
Johnson et al.

(10) Patent No.: US 10,555,439 B2
(45) Date of Patent: Feb. 4, 2020

(54) THERMAL INTERFACE MATERIALS WITH REINFORCEMENT FOR ABRASION RESISTANCE AND/OR SUITABLE FOR USE BETWEEN SLIDING COMPONENTS

(71) Applicant: Laird Technologies, Inc., Chesterfield, MO (US)

(72) Inventors: Keith David Johnson, Westlake, OH (US); Douglas S. McBain, Wadsworth, OH (US); Eugene Anthony Pruss, Avon Lake, OH (US); Jason L. Strader, Cleveland, OH (US)

(73) Assignee: Laird Technologies, Inc., Earth City, MO (US)

( * ) Notice: Subject to any disclaimer, the term of this patent is extended or adjusted under 35 U.S.C. 154(b) by 0 days.

(21) Appl. No.: 16/125,361

(22) Filed: Sep. 7, 2018

(65) Prior Publication Data

US 2019/0132994 A1    May 2, 2019

Related U.S. Application Data

(60) Provisional application No. 62/580,780, filed on Nov. 2, 2017.

(51) Int. Cl.
| | |
|---|---|
| H05K 7/20 | (2006.01) |
| C09K 5/14 | (2006.01) |
| H01R 13/6581 | (2011.01) |
| H01L 23/42 | (2006.01) |
| H01L 23/367 | (2006.01) |
| G02B 6/42 | (2006.01) |

(52) U.S. Cl.
CPC ........... *H05K 7/20454* (2013.01); *C09K 5/14* (2013.01); *G02B 6/4269* (2013.01); *H01L 23/367* (2013.01); *H01L 23/42* (2013.01); *H01R 13/6581* (2013.01); *H05K 7/20409* (2013.01); *H01L 23/3672* (2013.01)

(58) Field of Classification Search
CPC ............ H01R 13/6581; H05K 7/20454; H01L 23/367; H01L 23/42
USPC .......................................................... 439/487
See application file for complete search history.

(56) References Cited

U.S. PATENT DOCUMENTS

| | | | |
|---|---|---|---|
| 8,535,787 B1 * | 9/2013 | Lima ......................... | B32B 7/12 165/185 |
| 8,599,559 B1 * | 12/2013 | Morrison ............. | H05K 9/0058 361/702 |

(Continued)

FOREIGN PATENT DOCUMENTS

| | | |
|---|---|---|
| CN | 106932865 A | 7/2017 |
| CN | 107611213 A | 1/2018 |

(Continued)

OTHER PUBLICATIONS

PCT International Search Report and Written Opinion for PCT Application No. PCT/US2018/050484 filed Sep. 11, 2018, which claims priority to the instant application, dated Mar. 29, 2019, 14 pages.

*Primary Examiner* — Alexander Gilman
(74) *Attorney, Agent, or Firm* — Harness, Dickey & Pierce, P.L.C.; Anthony G. Fussner

(57) ABSTRACT

Exemplary embodiments are disclosed of thermal interface materials with reinforcement for abrasion resistance and/or suitable for use between sliding components.

19 Claims, 5 Drawing Sheets

(56) References Cited

U.S. PATENT DOCUMENTS

| | | | | |
|---|---|---|---|---|
| 2003/0171016 A1* | 9/2003 | Bright | ................ | G02B 6/4201 439/160 |
| 2004/0203289 A1* | 10/2004 | Ice | ................ | G02B 6/4277 439/607.2 |
| 2005/0058790 A1* | 3/2005 | Simon | ................ | B32B 27/32 428/35.7 |
| 2006/0274518 A1* | 12/2006 | Yu | ................ | H05K 7/1405 361/816 |
| 2008/0271875 A1* | 11/2008 | Lima | ................ | H01L 21/4882 165/80.3 |
| 2009/0166854 A1* | 7/2009 | Jewram | ................ | F28F 13/00 257/713 |
| 2010/0027220 A1* | 2/2010 | Hughes | ................ | H05K 7/20445 361/702 |
| 2010/0178783 A1* | 7/2010 | Bright | ................ | H01R 12/721 439/79 |
| 2011/0110048 A1* | 5/2011 | Lima | ................ | H05K 7/20418 361/720 |
| 2015/0092354 A1* | 4/2015 | Kelty | ................ | H05K 7/20563 361/722 |
| 2018/0034492 A1* | 2/2018 | Edgren | ................ | G02B 6/4269 |

FOREIGN PATENT DOCUMENTS

| | | |
|---|---|---|
| CN | 207398158 U | 5/2018 |
| JP | 2009049333 | 3/2009 |
| JP | 2009049333 A | 3/2009 |

* cited by examiner

THERMAL INTERFACE MATERIALS WITH REINFORCEMENT FOR ABRASION RESISTANCE AND/OR SUITABLE FOR USE BETWEEN SLIDING COMPONENTS

CROSS-REFERENCE TO RELATED APPLICATION

This application claims the benefit and priority of U.S. Provisional Application No. 62/580,780 filed Nov. 2, 2017. The entire disclosure of the above application is incorporated herein by reference.

FIELD

The present disclosure generally relates to thermal interface materials with reinforcement for abrasion resistance and/or suitable for use between sliding components.

BACKGROUND

This section provides background information related to the present disclosure which is not necessarily prior art.

Electrical components, such as semiconductors, integrated circuit packages, transistors, etc., typically have pre-designed temperatures at which the electrical components optimally operate. Ideally, the pre-designed temperatures approximate the temperature of the surrounding air. But the operation of electrical components generates heat. If the heat is not removed, the electrical components may then operate at temperatures significantly higher than their normal or desirable operating temperature. Such excessive temperatures may adversely affect the operating characteristics of the electrical components and the operation of the associated device.

To avoid or at least reduce the adverse operating characteristics from the heat generation, the heat should be removed, for example, by conducting the heat from the operating electrical component to a heat sink. The heat sink may then be cooled by conventional convection and/or radiation techniques. During conduction, the heat may pass from the operating electrical component to the heat sink either by direct surface contact between the electrical component and heat sink and/or by contact of the electrical component and heat sink surfaces through an intermediate medium or thermal interface material (TIM). The thermal interface material may be used to fill the gap between thermal transfer surfaces, in order to increase thermal transfer efficiency as compared to having the gap filled with air, which is a relatively poor thermal conductor.

DRAWINGS

The drawings described herein are for illustrative purposes only of selected embodiments and not all possible implementations, and are not intended to limit the scope of the present disclosure.

FIGS. 1, 2, and 3 illustrate an example of a heat sink including a pedestal or platform.

Corresponding reference numerals indicate corresponding parts throughout the several views of the drawings.

DETAILED DESCRIPTION

Figure 2:
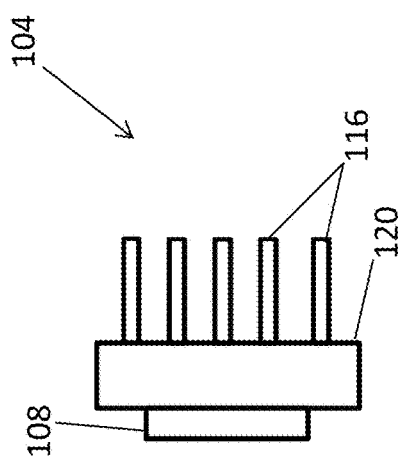

Example embodiments will now be described more fully with reference to the accompanying drawings.

The inventors hereof have recognized that some conventional thermal interface materials may not be sufficiently durable to withstand or resist the abrasion that may occur when a thermal interface material is used between sliding components. Accordingly, exemplary embodiments are disclosed herein of thermal interface materials with reinforcement for resisting abrasion when used between sliding components.

As disclosed herein, a thermal interface material (TIM) may be reinforced for resisting abrasion from kinetic or sliding friction when the TIM is relatively slid against a surface of another component. For example, the TIM may be slid along the surface of the another component while the another component is stationary. Or, for example, the TIM may be stationary while the another component slides along the TIM. As yet another example, both the TIM and the another component may slide relatively along each other, e.g., in opposite directions and/or in a same direction but at different speeds, etc.

In exemplary embodiments, a TIM is disposed (e.g., attached, applied, etc.) along a surface of a first component. For example, the TIM may be manually applied, stenciled, screen printed, applied using pick-n-place equipment, applied (e.g., tamped and removed, etc.) from a supply reel or roll, etc. The TIM may be relatively slid against a surface of a second component. The first and second components may comprise a wide range of components, such as a heat sink, a heat spreader, a heat pipe, a vapor chamber, other heat removal/dissipation structure, a portion of a housing or cage, a surface within a cavity, etc. For example, the TIM may be disposed along a surface of a first component that is slid into and/or out of a cavity. Or, for example, the TIM may be disposed along a surface within a cavity, and another component may be slid into and/or out of the cavity in which the TIM is disposed. In these examples, the TIM may be disposed along a first component that may comprise a connector plug, a slidable part of a tablet or other modular portable device, etc. The cavity may be defined by a cage of a transceiver (e.g., small form-factor pluggable (SFP) fiber optic transceiver, etc.), by a tablet, by a modular portable device in which parts are slid into place instead of layered on top of each other, etc.

In an exemplary embodiment, a TIM with reinforcement is disposed along a heat removal/dissipation structure (e.g., heat sink, heat pipe, vapor chamber, heat spreader, another TIM, etc.). The heat removal/dissipation structure is disposed within or is an integral part of a cage (broadly, a housing) of a transceiver (broadly, a device), such as a small form-factor pluggable (SFP) transceiver, SFP+ transceiver, quad small form-factor pluggable (QSFP) transceiver, QSFP+ transceiver, XFP transceiver, etc. As disclosed herein, the TIM may be reinforced to resist abrasion during connector plug insertion into and/or removal from a cage or housing.

Although exemplary embodiments of TIMs with reinforcement may be used with transceivers, the TIMs with reinforcement may be used with a wide range of other devices, including wide range of transceivers, other devices having housings, cages, or cavities, other devices configured for use with other connectors besides SFP cable connectors, modular portable devices (e.g., tablets, etc.) in which parts are slid into place instead of being layered or stacked on top of each other, etc. For example, another exemplary embodiment includes a TIM with reinforcement disposed along a part or subcomponent of a tablet or modular portable device.

In exemplary embodiments, the thermal interface materials (TIMs) have low effective thermal resistance (e.g., less than 2° C./W, less than 0.2° C./W, within a range from about 0.2° C./W to about 2° C./W, etc.). As disclosed herein, reinforcements are provided such that the TIMs have sufficiently good durability and abrasion resistance. Advantageously, the reinforcement may allow the TIM to survive and/or withstand sliding operations (e.g., repeated connector plug insertion into and/or removal from a cage of a transceiver, sliding installation of a component, etc.) including at elevated temperatures (e.g., 75° C. or above, etc.). The reinforcement may be configured to confine the TIM within a predetermined area (e.g., a channel along a heat sink, other heat removal/dissipation structure, etc.) such that the TIM is contained within the predetermined area (e.g., the TIM is not abraded or scraped, etc.) during sliding operations (e.g., during connector plug insertion/removal process, component or part sliding installation, etc.) thereby maintaining TIM integrity.

In exemplary embodiments, a thermal interface material (TIM) is disposed along (e.g., attached or coupled in thermal contact with, etc.) a first component, e.g., a heat sink, heat pipe, vapor chamber, heat spreader, other heat removal/dissipation structure, other component, etc. For example, the TIM may be positioned along a first surface of a first component that is opposite a second surface of the first component, which second surface is coupled to an inner surface within and/or defining part of a cavity. The first component may thus be generally between (e.g., attached or coupled in thermal contact with, etc.) the TIM and the inner surface of the cavity. The TIM may be generally between the first component and a second component when the second component is slidably positioned within the cavity.

The TIM and the first component may cooperatively define or establish a thermally-conductive heat path from the second component to the inner surface of the cavity. Therefore, heat may be transferred along this thermally-conductive heat path from the second component to the TIM, from the TIM to the first component, and from the first component to the inner surface of the cavity. From the inner surface of the cavity, heat may be transferred through the cavity wall to an external component outside the cavity, such as a heat sink, other heat removal/dissipation structure (e.g., heat spreader, etc.), and/or to the environment.

In other exemplary embodiments, the first component may be the component (or portion thereof) that integrally defines the cavity. In yet other exemplary embodiments, the first component may be eliminated, and the TIM may be disposed directly along the inner surface of the cavity without any intervening components between the TIM and the inner surface of the cavity. Additionally, or alternatively, a TIM may be disposed along (e.g., attached or coupled in thermal contact with, etc.) the second component. In this example, the TIM may be slid into and out of the cavity along with the second component when the second component is slidably inserted into and removed from the cavity.

To improve survivability of the TIM during the relatively sliding of the first and second components (e.g., repeated connector plug insertion into and/or removal from an SFP cage, sliding installation of the first component, etc.), exemplary embodiments disclosed herein include reinforcements along one or more edge or perimeter portions of the TIMs. For example, reinforcement may be provided at least partially along the TIM's opposing edge or perimeter portions that are generally perpendicular to and/or parallel with the directions in which the second component is slidably inserted into/removed from the cavity. Or, for example, reinforcement may be provided along the TIM's entire perimeter or along all of the TIM's edges such that the reinforcement generally surrounds the TIM.

In an exemplary embodiment, strips of reinforcement material (e.g., polyethylene terephthalate (PET) or polyimide film, etc.) are applied along a portion of a first component. For example, first and second strips of reinforcement material may be applied along opposing first and second longitudinal edges of a pedestal or platform (broadly, a protruding portion) of a heat sink or other heat removal/dissipation structure, etc. Thermal interface material (TIM) is applied or added within the channel or area defined generally between the strips of reinforcement material. As compared to the strips of reinforcement material, the TIM is softer, more compliant, less durable, and/or more susceptible to abrasion (e.g., more susceptible to scraping or abrading away from kinetic or sliding friction when the TIM is relatively slid against a surface of a second component, etc.). During the sliding motion of a second component relative to the first component, the strips of reinforcement material may absorb compression forces and help confine the TIM within the channel or area defined generally between the strips of reinforcement material, thereby helping to maintain integrity of the softer TIM.

In another exemplary embodiment, reinforcement of a first TIM is provided by one or more wall portions of a second TIM (broadly, a second material) disposed at least partially around the first TIM. As compared to the second TIM, the first TIM is softer, more compliant, less durable, and/or more susceptible to abrasion (e.g., scraping or abrading away, etc.). The wall portions of the second TIM are configured to confine the first TIM within a predetermined area defined generally between the wall portions. For example, the wall portions of the second TIM may provide or define a channel, pocket, or walled off area along a surface of a first component in which the first TIM is contained even when the first TIM is contacted by a second component sliding relative to the first component. During the sliding motion of the second component relative to the first component, the wall portions of the second TIM absorb compression forces thereby helping to maintain integrity of the softer first TIM.

The wall portions of the second TIM may completely surround an entire perimeter of the first TIM to inhibit or prevent migration of the first TIM in all directions along the heat sink. Or, for example, the wall portions of the second TIM may be along only the first TIM's opposing edge or perimeter portions that are generally parallel with or perpendicular to first and second directions in which the second component is slid relative to the first component, thereby inhibiting or preventing migration of the first TIM along the heat sink in the first and second directions. Further, the one or more wall portions along the edges of the first TIM may be formed from the same material(s), or at least one wall portion may be made from a material(s) different than the material(s) used to make another one of the wall portions.

The first and/or second TIM may comprise a wide range of other thermal interface materials. In addition, other exemplary embodiments may include another material(s) (e.g., non-thermally enhanced material, thermal insulator, etc.) besides a thermal interface material that are used to provide one or more wall portions to reinforce and confine the first TIM.

The wall portions of the second TIM may have a height greater than or about equal to a thickness of the first TIM, such that only a relatively thin portion (or none at all) of the first TIM protrudes beyond the wall portions of the second TIM. The first TIM may have a coefficient of thermal expansion (CTE) (e.g., a known CTE higher than the CTE of the second TIM, etc.) such that upon heating the first TIM may expand and increase contact with the first component and second component resulting in a lower thermal resistance. The first TIM may be an exposed grease that comes in direct contact with the first and second components, or the first TIM may be a material contained inside of another more robust material that allows for abrasion resistance, such as during a "hot swap" at 75° C., etc.

Another exemplary embodiment includes building up a dam (or one or more wall portions) along the surface of a first component with a material harder than the TIM, such as polyethylene terephthalate (PET) or polyimide film, etc. The dam of the harder material defines or provides a channel, pocket, or walled off area along the first component to which the softer TIM is added. The dam of the harder material may generally surround the softer TIM to thereby reinforce the softer TIM and confine the softer TIM to the predetermined area defined by the dam along the first component. During the sliding of the second component relatively along the first component, the dam of the harder material may absorb compression forces thereby helping to maintain integrity of the softer TIM.

The dam of harder material may have a height greater than or about equal to a thickness of the softer TIM, such that only a relatively thin portion (or none at all) of the softer TIM protrudes beyond the dam. The softer TIM may have a coefficient of thermal expansion (CTE) (e.g., a known CTE higher than the CTE of the harder material used for the dam, etc.) such that upon heating the softer TIM may expand and increase contact with the first and second components resulting in a lower thermal resistance. The softer TIM may be an exposed grease that comes in direct contact with the first and second components.

In another exemplary embodiment, a channel, pocket, recess, or other predetermined area is formed directly on the surface of a first component, such as by machining (e.g., milling, etc.), etching, other material removal process, etc. Or, for example, the first component may instead be initially formed (e.g., die cast, molded, etc.) to integrally include the channel, pocket, recess, etc. By way of example, the surface of the first component may be milled to create a recess, pocket, channel, etc. to which a TIM (e.g., thermal grease, thermal phase change material, other soft or compliant TIM, etc.) is added.

The depth of the milled recess, pocket, channel, etc. along the first component is preferably sufficient such that the TIM is entirely or mostly confined within the milled recess, pocket, channel, etc. such that only a relatively thin portion (or none at all) of the TIM protrudes beyond the surface of the first component. The TIM may have a coefficient of thermal expansion (CTE) (e.g., a known CTE higher than the CTE of the heat sink, etc.) such that upon heating the TIM may expand and increase contact with the first and second components resulting in a lower thermal resistance. The TIM may be an exposed grease that comes in direct contact with the first and second components.

Figure 1:
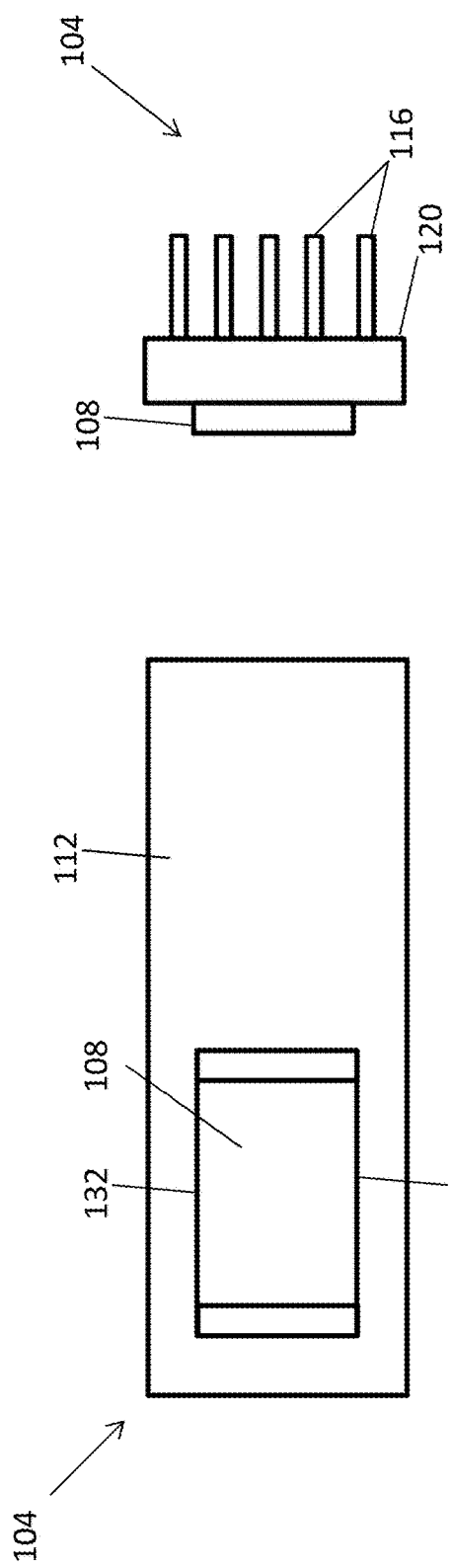
Figure 3:
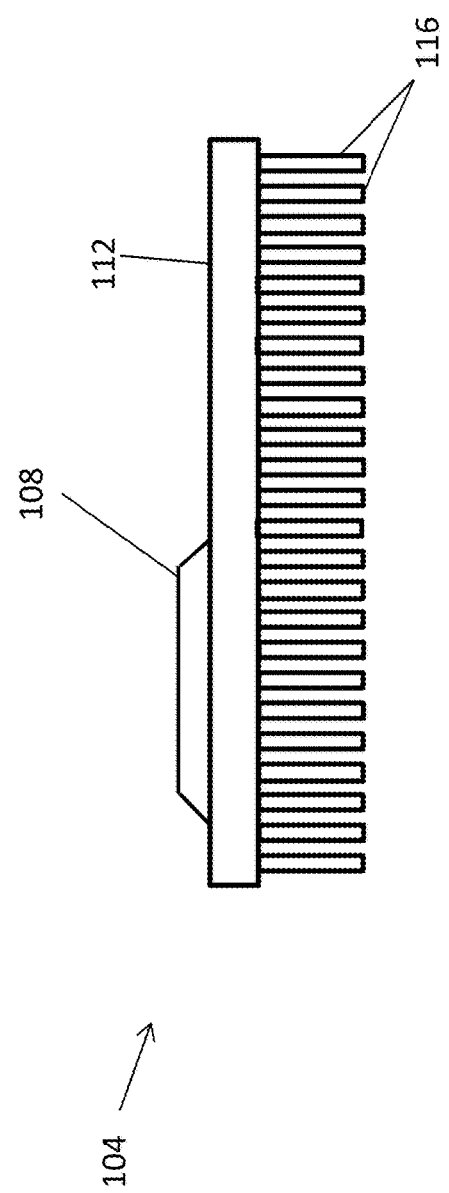

With reference now to the figures, FIGS. 1, 2, and 3 illustrate an example of a heat sink 104 (broadly, heat removal/dissipation structure) including a pedestal or platform 108 (broadly, a portion). The pedestal 108 protrudes outwardly from a surface of a first side 112 of the heat sink 104. A plurality of fins 116 protrude outwardly from a second side 120 of the heat sink 104 opposite the first side 112.

Figure 4:
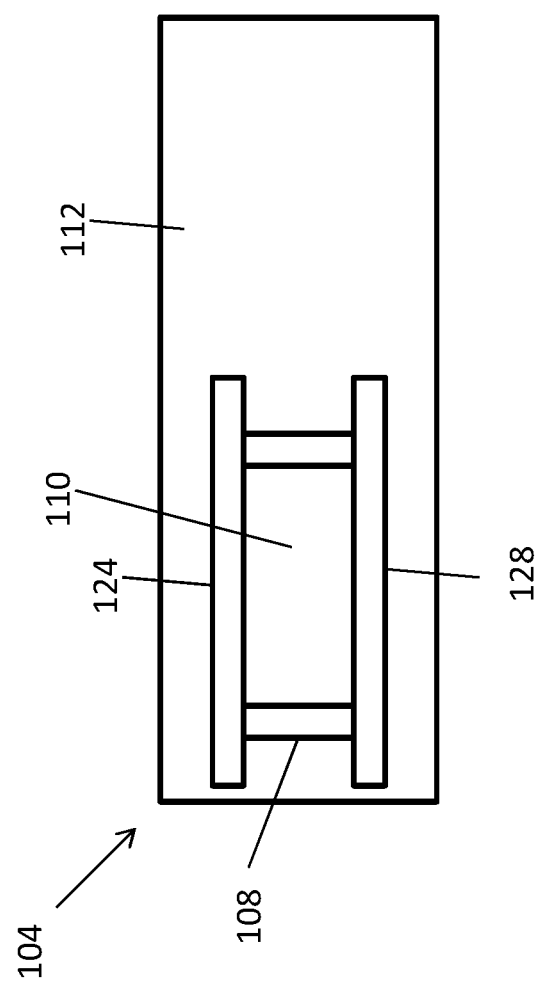
FIG. 4 illustrates the heat sink shown in FIGS. 1, 2, and 3, and also illustrating first and second strips of reinforcement material along opposing first and second edges of the heat sink pedestal according to an exemplary embodiment.
Figure 5:
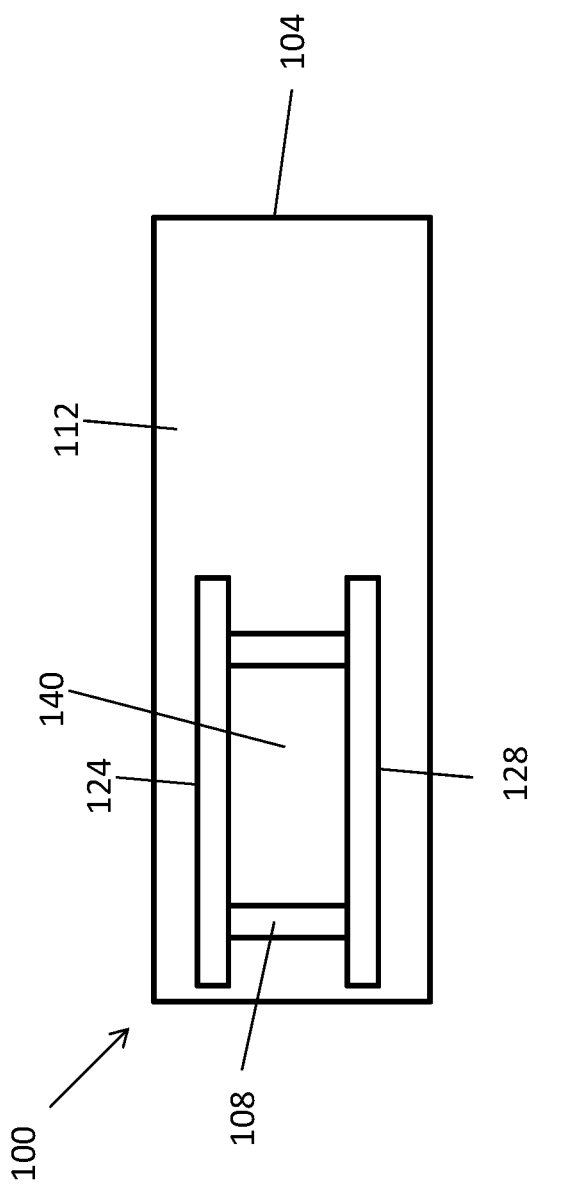
FIG. 5 illustrates the heat sink with the strips of reinforcement material shown in FIG. 4, and also illustrating a thermal interface material along the heat sink pedestal within a channel defined generally between the first and second strips of reinforcement material according to an exemplary embodiment.

As shown in FIG. 4, first and second strips of reinforcement material 124, 128 (broadly, reinforcement) are applied along (e.g., entirely and continuously along without any gaps, etc.) opposing first and second edges 132, 136 of the heat sink pedestal 108 according to this exemplary embodiment. By way of example, the first and second strips of reinforcement material 124, 128 may comprise polyethylene terephthalate (PET) or polyimide film. Alternatively, other reinforcement materials may be used for the strips 124, 128 that are harder, less compliant, more durable, and/or less susceptible to abrasion than the thermal interface material (TIM) 140 shown in FIG. 5. In addition, other exemplary embodiments may include strips of reinforcement material along less than the entire length of the pedestal edges and/or in a non-continuous pattern (e.g., spaced apart strip portions with gaps therebetween, etc.) along the pedestal edges, and/or along other edges of the pedestal, etc. For example, another exemplary embodiment may include four strips of reinforcement material along each of the four edges of the rectangular pedestal. Also, other exemplary embodiments may include a heat sink with a non-rectangular pedestal and/or strips of reinforcement materials that are not all made of the same material.

The TIM 140 (FIG. 5) is applied along the heat sink pedestal 108 within a channel 110 (FIG. 4) (broadly, an area) defined generally between the first and second strips of reinforcement material 124, 128. As disclosed herein, a wide range of thermal interface materials may be used for the TIM 140, such as a thermal gap filler, thermal phase change material, thermally-conductive EMI absorber or hybrid thermal/EMI absorber, thermal putty, thermal pad, thermal grease, etc. In exemplary embodiments, the TIM 140 has a higher thermal conductivity than the strips of reinforcement material 124, 128. But the TIM 140 is softer, more compliant, less durable, and/or more susceptible to abrasion than the strips of reinforcement material 124, 128. When another component (e.g., SFP connector plug, SFP cage, etc.) is slid relative to the heat sink 104 and TIM 140, the strips of reinforcement material 124, 128 may absorb compression forces and help confine the TIM 140 within the channel or area 110 defined generally between the strips of reinforcement material 124, 128, thereby helping to maintain integrity of the TIM 140.

The thickness of the TIM 140 may be sufficient such that the TIM 140 does not protrude beyond the thickness or height of the strips of reinforcement material 124, 128. Stated differently, the strips of reinforcement material 124, 128 may have a thickness or height greater than or about equal to a thickness of the TIM 140, such that only a relatively thin portion (or none at all) of the TIM 140 protrudes beyond the strips of reinforcement material 124, 128.

The TIM 140 may have a coefficient of thermal expansion (CTE) (e.g., a known CTE higher than the CTE of the strips of reinforcement material 124, 128, etc.) such that upon heating the TIM 140 expands and increases contact with the heat sink 104 and the second component (e.g., SFP connector plug, etc.) resulting in a lower thermal resistance.

The assembly 100 (FIG. 5) including the heat sink 104, strips of reinforcement materials 124, 128, and TIM 140 may be used with a wide range of devices. Also, aspects of the present disclosure are not limited to use with only heat sinks as the strips of reinforcement materials 124, 128 and TIM 140 may be applied to other heat removal/dissipation structures and/or components, e.g., a heat removal/dissipation structure that is part of a housing or cage itself, a heat pipe, a vapor chamber, a heat spreader, etc.

Figure 6:
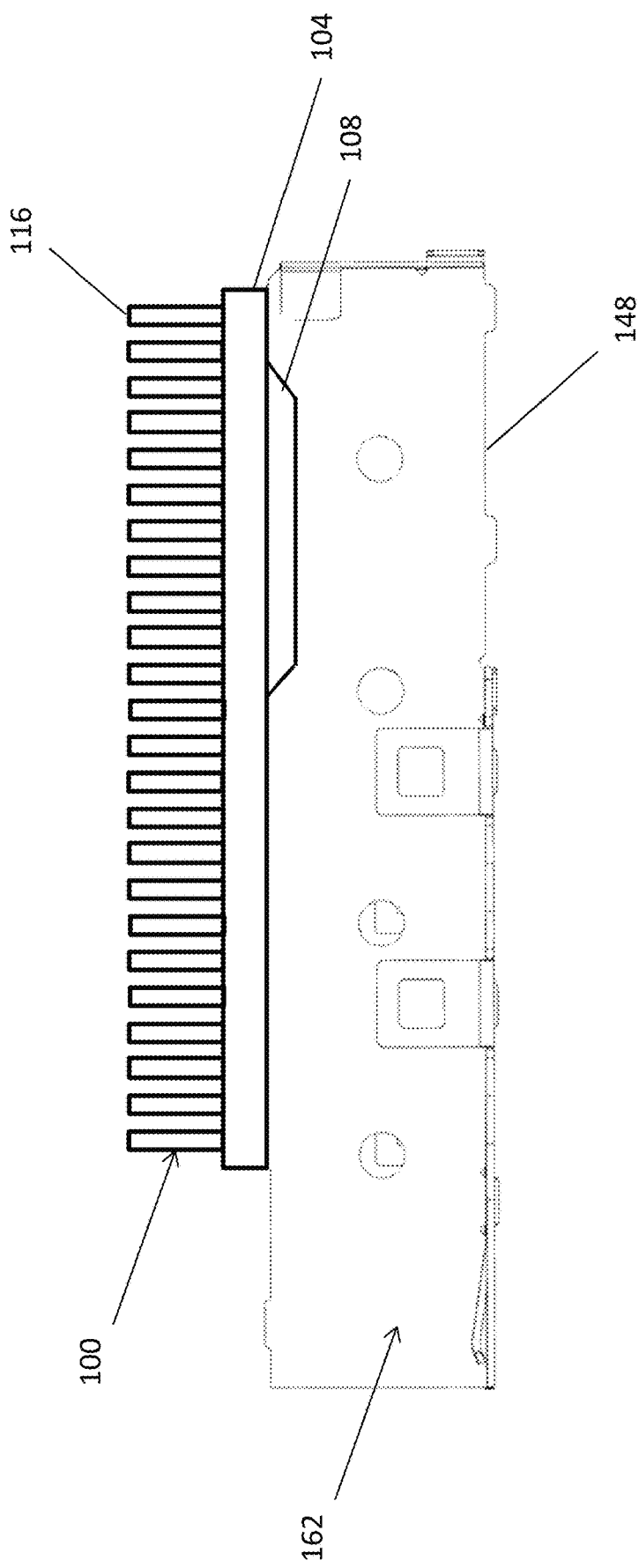
FIG. 6 illustrates the heat sink shown in FIG. 5 positioned along a top of a cage of a small form-factor pluggable (SFP) fiber optic transceiver according to an exemplary embodiment.
Figure 7:
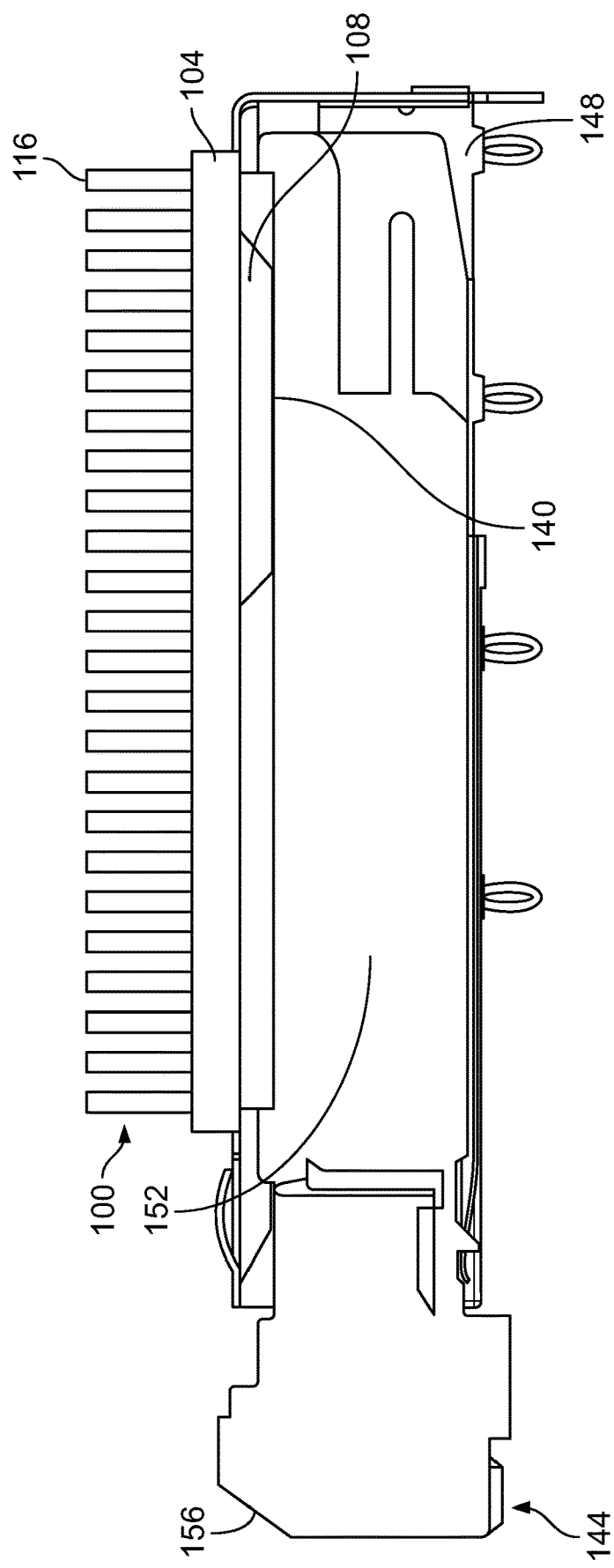
FIG. 7 illustrates the heat sink and SFP cage shown in FIG. 6, and further illustrating a connector plug received within a cavity defined by the cage of the SFP transceiver according to an exemplary embodiment.

For purposes of example only, FIGS. 6 and 7 illustrate an exemplary embodiment in which the assembly 100 (FIG. 5) is used with a small form-factor pluggable (SFP) fiber optic transceiver 144 (broadly, a device or component). As shown in FIG. 6, the heat sink 104 is positioned along a top of an SFP cage 148 (broadly, a housing) with the pedestal 108 facing downwardly relative to the top of the SFP cage 148. The heat sink 104 may be coupled to the SFP cage 148 by one or more spring clips, screws, other mechanical fasteners, etc.

As shown in FIG. 7, the TIM 140 along the pedestal 108 thermally contacts a portion 152 of an SFP connector plug 156 (broadly, a connector) when the portion 152 of the SFP connector plug 152 is slidably inserted into the cavity 162 defined by or within the SFP cage 148. In this example, the strips of reinforcement material 124, 128 may absorb compression forces and help confine the TIM 140 within the channel or area 110 defined generally between the strips of reinforcement material 124, 128 when the portion 152 of the SFP connector plug 152 is slidably inserted into or removed from the cavity 162, thereby helping to maintain integrity of the TIM 140.

The TIM 140 may be generally between the heat sink 104 and the connector plug 156 when the connector plug 156 is within the cage 148. Accordingly, the TIM 140 and the heat sink 104 may cooperatively define or establish at least a portion of a thermally-conductive heat path from the connector plug 156 to the fins 116 of the heat sink 104. Therefore, heat may be transferred along this thermally-conductive heat path from the connector plug 156 to the TIM 140, from the TIM 140 to the heat sink 104, and from the heat sink fins 116 to another heat removal/dissipation structure (e.g., heat spreader, etc.), and/or to the environment. The heat transfer may reduce a temperature of the cage 148 and the cable connector 156, to thereby help maintain a temperature of the cage 148 and the cable connector 156 below a specified threshold, etc. The TIM 140 and the heat sink 104 may include any suitable materials, configurations, etc. suitable to reduce the temperature of the cage 148 and cable connector 156. For example, the TIM and heat sink materials and configurations may be selected such that the TIM 140 and the heat sink 104 are capable of dissipating heat at a rate sufficient to maintain the temperature of the cage 148 and the cable connector 156 below a specified threshold temperature at which operation of the cable connector 156 would otherwise be impaired. Transfer of heat to the TIM 140 may reduce the amount of heat that is transferred from the cable connector 156 to another component, such as a printed circuit board (PCB) of the SFP transceiver 144, thereby reducing the amount of heat that could dissipate further from the PCB to more heat sensitive components.

By way of background, small form-factor pluggable (SFP) fiber optic transceivers are compact, hot-pluggable transceivers that may be used for telecommunications, data communications applications, etc. A SFP transceiver may interface a network device motherboard (e.g., for a switch, router, media converter, etc.) to a fiber optic or copper networking cable. SFP transceivers may support communications standards including SONET, gigabit Ethernet, Fibre Channel, etc. As used herein, small form-factor pluggable (SFP) may also include or be used in reference to other small form-factor pluggables, such as SFP+, quad (4-channel) small form-factor pluggable (QSFP), QSFP+, etc.

A conventional SFP transceiver assembly may include a pluggable module or connector plug and a receptacle assembly, which, in turn, is mounted on a printed circuit board (PCB). The pluggable module may be configured to be inserted into a front opening and cavity defined by a cage of the receptacle assembly. The pluggable module may include a housing having a portion that is held against a heat sink (e.g., at a moderate pressure, etc.) after the pluggable module is inserted into the cage. The pluggable module may subsequently be removed from the cage of the receptacle assembly. A connector plug or pluggable module may undergo numerous insertions into and removals from a cage (e.g., QSFP cage, etc.). And, the insertion/removal process may occur at elevated temperatures, such as when the junction temperature is 75 degrees Celsius (° C.) or above, etc.

But the inventors hereof have recognized that conventional thermal solutions for SFP transceivers either lack low thermal resistance and/or are not durable to withstand repeated insertion/removal of a connector plug. Accordingly, the inventors have developed and/or disclose herein exemplary embodiments of thermal interface materials (TIMs) (e.g., TIM 140, etc.) with low effective thermal resistance (e.g., less than 2° C./W, less than 0.2° C./W, within a range from about 0.2° C./W to about 2° C./W, etc.) and with reinforcement (e.g., strips of reinforcement materials 124, 128, etc.) for good durability and abrasion resistance, such that the TIMs are useful between sliding components, such as between an connector (e.g., connector plug 156, etc.) and a housing or cage (e.g., SFP cage 148, etc.), etc. Advantageously, the reinforcement may allow the TIM to survive and/or withstand repeated connector plug insertion into and/or removal from a cage of a transceiver or other device including at elevated temperatures (e.g., 75° C. or above, etc.). The reinforcement may be configured to confine the TIM within a predetermined area (e.g., along a heat sink, along another heat removal/dissipation structure, along a portion of the SFP cage itself, etc.) such that the TIM is contained within the predetermined area (e.g., the TIM is not abraded or scraped away, etc.) during the connector plug insertion/removal process, thereby maintaining TIM integrity. The reinforcement may improve survivability of the TIM during repeated connector plug insertion into and/or removal from an SFP cage.

The cage (e.g., cage 148, etc.) may be any suitable cage capable of receiving an SFP cable connector. The cage may have dimensions corresponding to an SFP connector to allow insertion of the SFP cable connector plug into the cage. The cage may receive the cable connector plug via any suitable releasably coupled engagement, including but not limited to a friction fit, a snap fit, etc. The cage may include an interface for transmitting and/or receiving signals via the SFP connector, such as an optical cable interface, an electrical cable interface, etc. The interface may allow for communication to and/or from the cable connector to a motherboard, printed circuit board (PCB), network card, etc. to which the cage is mounted.

The cage (e.g., cage 148, etc.) may comprise any suitable material, including metal, etc. For example, the cage may comprise a material suitable for shielding against noise generated by the transfer of data through the cable connector plug (e.g., electromagnetic interference (EMI) shielding, etc.). Alternative embodiments may include other devices, such as other transceivers (e.g., SFP+ transceivers, XFP transceivers, QSFP transceivers, QSFP+ transceiver, etc.), devices having housings or cages configured for use with other connectors besides SFP cable connectors, etc. Accordingly, aspects of the present disclosure should not be limited to SFP transceivers and SFP cable connectors.

Some exemplary embodiments may include one or more thermoelectric module, such as a thermoelectric module coupled between a side of the cage and the heat sink and/or a thermoelectric module coupled between the TIM and the heat sink, etc. A thermoelectric module may be any suitable module capable of transferring heat between opposing sides of the module when a voltage is applied to the module. A thermoelectric module may have a hot side oriented towards the connector plug within the cage and a cold side oriented in a direction away from the connector plug within the cage.

Example thermal interface materials that may be used in exemplary embodiments include thermal gap fillers, thermal phase change materials, thermally-conductive EMI absorbers or hybrid thermal/EMI absorbers, thermal putties, thermal pads, etc.

In some embodiments, the TIM may include a silicone elastomer. The silicone elastomer may be filled with a suitable thermally-conductive material, including ceramic, boron nitride, etc. In some embodiments, the TIM may comprise a graphite sheet material, a metal foil, a multi-laminate structure, such as a multi-laminate structure of metal and plastic, a multi-laminate structure of metal and graphite, or a multi-laminate structure of metal, graphite, and plastic.

The TIM may include a thermal interface material from Laird Technologies, such as any one or more of the Tputty™ 502 series thermal gap fillers, Tflex™ series gap fillers (e.g., Tflex™ 300 series thermal gap filler materials, Tflex™ 600 series thermal gap filler materials, Tflex™ 700 series thermal gap filler materials, etc.), Tpcm™ series thermal phase change materials (e.g., Tpcm™ 580 series phase change materials, Tpcm™ 780 series phase change materials, Tpcm™ 900 series phase change materials etc.), Tpli™ series gap fillers (e.g., Tpli™ 200 series gap fillers, etc.), IceKap™ series thermal interface materials, and/or CoolZorb™ series thermally conductive microwave absorber materials (e.g., CoolZorb™ 400 series thermally conductive microwave absorber materials, CoolZorb™ 500 series thermally conductive microwave absorber materials, CoolZorb™ 600 series thermally conductive microwave absorber materials, etc.), Tmate™ 2900 series reusable phase change materials, Tgon™ 800 series thermal interface materials or natural graphite sheets, Tgon™ 8000 series thermal interface materials or graphite sheets, Tgon™ 9000 series graphite sheets (e.g., Tgon™ 9017, 9025, 9040, 9070, 9100, etc.), Tgon™ encapsulate or potting compounds, such as Tgon™ 455-18SH, other graphite sheet materials, etc.

In some exemplary embodiments, the TIM may comprise a compliant gap filler having high thermal conductivity. By way of example, the TIM may comprise a thermal interface material of Laird, such as one or more of Tflex™ 200, Tflex™ HR200, Tflex™ 300, Tflex™ 300 TG, Tflex™ HR400, Tflex™ 500, Tflex™ 600, Tflex™ HR600, Tflex™ SF600, Tflex™ 700, Tflex™ SF800 thermal gap fillers.

The TIM may comprise an elastomer and/or ceramic particles, metal particles, ferrite EMI/RFI absorbing particles, metal or fiberglass meshes in a base of rubber, gel, or wax, etc. The TIM may include compliant or conformable silicone pads, non-silicone based materials (e.g., non-silicone based gap filler materials, thermoplastic and/or thermoset polymeric, elastomeric materials, etc.), silk screened materials, polyurethane foams or gels, thermally-conductive additives, etc. The TIM may be configured to have sufficient conformability, compliability, and/or softness (e.g., without having to undergo a phase change or reflow, etc.) to adjust for tolerance or gaps by deflecting at low temperatures (e.g., room temperature of 20° C. to 25° C., etc.) and/or to allow the thermal interface materials to closely conform (e.g., in a relatively close fitting and encapsulating manner, etc.) to a mating surface when placed in contact with (e.g., compressed against, etc.) the mating surface, including a non-flat, curved, or uneven mating surface.

The TIM may include a soft thermal interface material formed from elastomer and at least one thermally-conductive metal, boron nitride, and/or ceramic filler, such that the soft thermal interface material is conformable even without undergoing a phase change or reflow. In some exemplary embodiments, the TIM may include ceramic filled silicone elastomer, boron nitride filled silicone elastomer, or a thermal phase change material that includes a generally non-reinforced film.

Exemplary embodiments may include one or more thermal interface materials having a high thermal conductivity (e.g., 1 W/mK (watts per meter per Kelvin), 1.1 W/mK, 1.2 W/mK, 2.8 W/mK, 3 W/mK, 3.1 W/mK, 3.8 W/mK, 4 W/mK, 4.7 W/mK, 5 W/mK, 5.4 W/mK, 6 W/mK, etc.) depending on the particular materials used to make the thermal interface material and loading percentage of the thermally conductive filler, if any. These thermal conductivities are only examples as other embodiments may include a thermal interface material with a thermal conductivity higher than 6 W/mK, less than 1 W/mK, or other values and ranges between 1 and 6 W/mK. Accordingly, aspects of the present disclosure should not be limited to use with any particular thermal interface material as exemplary embodiments may include a wide range of thermal interface materials.

In exemplary embodiments, the TIM may comprise one or more graphite sheets such as one or more Tgon™ 9000 series graphite sheets. Tgon™ 9000 series graphite sheets comprise synthetic graphite thermal interface materials having a carbon in-plane mono-crystal structure and that are ultra-thin, light-weight, flexible and offer excellent in-plane thermal conductivity. Tgon™ 9000 series graphite sheets are useful for a variety of heat spreading applications where in-plane thermal conductivity dominates and in limited spaces. Tgon™ 9000 series graphite sheets may have a thermal conductivity from about 500 to about 1900 W/mK, may help reduce hot spots and protect sensitive areas, may enable slim device designs due to the ultra-thin sheet thickness of about 17 micrometers to 25 micrometers, may be bight weight with density from about 2.05 g/cm$^3$ to 2.25 g/cm$^3$, may be flexible and able to withstand more than 10,000 times bending with radius of 5 millimeters. Table 1 below includes addition details about Tgon™ 9000 series graphite sheets.

TABLE 1

| Product Name | | Test Method | Tgon 9017 | Tgon 9025 | Tgon 9040 | Tgon 9070 | Tgon 9100 |
|---|---|---|---|---|---|---|---|
| Thickness (mm) | | ASTM D374 | 0.017 +/− 0.005 | 0.025 +/− 0.005 | 0.04 +/− 0.005 | 0.07 +/− 0.01 | 0.1 +/− 0.01 |
| Thermal conductivity (W/mK) | X,Y direction | ASTM E1461 | 1650~1900 | 1500~1700 | 1150~1400 | 700~1000 | 500~700 |
| | Z direction | | 15 | 15 | 15 | 15 | 15 |
| Thermal diffusivity (cm$^2$/s) | | ASTM E1461 | 9 | 9 | 8 | 7 | 7 |
| Density (g/cm$^3$) | | ASTM D792 | 2.05~2.25 | 2.05~2.25 | 1.65~1.85 | 1.0~1.3 | 0.7~1.0 |
| Specific heat (50° C.)(J/gK) | | ASTM E1269 | 0.85 | 0.85 | 0.85 | 0.85 | 0.85 |
| Heat resistance (° C.) | | Over 100 hours of testing | 400 | 400 | 100 | 400 | 400 |
| Extensional strength (MPa) | X, Y direction | ASTM F152 | 39 | 28 | 23 | 20 | 19.2 |
| | Z direction | | 0.1 | 0.4 | 0.4 | 0.4 | 0.65 |
| Bending test (times) (RS/180°) | | ASTM D2176 | 10,000 or more | 10,000 or more | 10,000 or more | 10,000 or more | 10,000 or more |
| Electric conductivity (S/cm) | | ASTM E1269 | 20000 | 20000 | 20000 | 96000 | 96000 |

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific numerical dimensions and values, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (the disclosure of a first value and a second value for a given parameter may be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "includes," "including," "has," "have," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and may be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An assembly suitable for use between sliding components, the assembly comprising:
    a thermal interface material positionable generally between a first component and a second component slidable relative to the first component; and
    reinforcement comprising one or more strips of reinforcement material and configured to define an area along a surface of the first component and provide abrasion resistance for the thermal interface material when the thermal interface material is within the area defined by the reinforcement and slid relatively against a surface of the second component, wherein the reinforcement is configured to define the area along a surface of the first component such that a portion of the thermal interface material remains exposed for making contact with the surface of the second component;
    wherein the reinforcement has a height greater than a height of the thermal interface material relative to the surface of the first component along which the area is defined such that the thermal interface material does not protrude outwardly beyond the reinforcement; and
    wherein the thermal interface material has a coefficient of thermal expansion higher than a coefficient of thermal expansion of the reinforcement, whereby upon heating the thermal interface material expands outwardly beyond the reinforcement, which increases contact with the surface of the second component thereby resulting in a lower thermal resistance.

2. The assembly of claim 1, wherein:
    the reinforcement is along each of a plurality of edge or perimeter portions of the thermal interface material that are generally parallel and/or perpendicular to a direction in which the second component is slidable relative to the first component when the thermal interface material is generally between the first and second components; and
    the reinforcement is configured to confine the thermal interface material within the area defined by the reinforcement and thereby inhibits migration of the thermal interface material from out of the area in all directions along the first component.

3. The assembly of claim 1, wherein:
    the thermal interface material has a thermal conductivity of at least 1 W/m-K and includes a front edge portion, a back edge portion opposite the front edge portion, a first side edge portion, and a second side edge portion opposite the first side edge portion, the first and second side edge portions generally parallel to a direction in which the second component is slidable relative to the first component, the front and back edge portions are generally perpendicular to the direction in which the second component is slidable relative to the first component; and
    the reinforcement is along only the first and second side edge portions, and not the front and back edge portions, of the thermal interface material, such that the reinforcement is generally parallel to the direction in which the second component is slidable relative to the first component when the thermal interface material is generally between the first and second components.

4. The assembly of claim 1, wherein:
    the thermal interface material includes edges defining an outer perimeter of the thermal interface material; and
    the reinforcement is along each said edge of the thermal interface material such that the reinforcement is along an entirety of the outer perimeter of the thermal interface material and thereby generally surrounds the thermal interface material, confines the thermal interface material within the area defined by the reinforcement, and inhibits migration of the thermal interface material from out of the area in all directions along the first component.

5. The assembly of claim 1, wherein the reinforcement comprises first and second reinforcement portions respectively parallel and perpendicular to a direction in which the second component is slidable relative to the first component when the thermal interface material is generally between the first and second components, whereby the first and second reinforcement portions provide resistance against abrasion from kinetic friction when the thermal interface material is slid relatively against and in direct contact with a surface of the second component.

6. The assembly of claim 1, wherein:
    the one or more strips of reinforcement material are configured to be applied along one or more portions of the first component to thereby define a channel along the surface of the first component generally between the one or more strips of reinforcement material; and
    the thermal interface material is configured to be applied along the surface of the first component within the channel defined generally between the one or more strips of reinforcement material.

7. The assembly of claim 6, wherein the one or more strips of reinforcement material comprise polyethylene terephthalate film and/or polyimide film, and wherein:
the thermal interface material has a thermal conductivity of at least 1 W/m-K, which is higher than a thermal conductivity of the one or more strips of reinforcement material;
the one or more strips of reinforcement material are configured to absorb compression forces and help confine the thermal interface material within the channel defined generally between the one or more strips of reinforcement material; and
the thermal interface material does not protrude outwardly beyond the one or more strips of reinforcement material except upon heating whereby the thermal interface material expands outwardly beyond the one or more strips of reinforcement material, which thereby increases contact between the thermal interface material and the surface of the second component thereby resulting in a lower thermal resistance.

8. The assembly of claim 1, wherein the thermal interface material is a first thermal interface material having a thermal conductivity of at least 1 W/m-K, and the reinforcement comprises one or more wall portions of a second thermal interface material having a thermal conductivity of at least 1 W/m-K and that is disposed at least partially around the first thermal interface material, whereby the one or more wall portions of the second thermal interface material are configured to confine the first thermal interface material within the area defined generally between the one or more wall portions of the second thermal interface material; and wherein:
the first thermal interface material is softer than the second thermal interface material; and
the first thermal interface material does not protrude outwardly beyond the one or more wall portions of the second thermal interface material; and
the first thermal interface material has a coefficient of thermal expansion higher than a coefficient of thermal expansion of the second thermal interface material such that upon heating the first thermal interface material expands outwardly beyond the one or more wall portions of the second thermal interface material, which thereby increases contact between the first thermal interface material and the surface of the second component thereby resulting in a lower thermal resistance.

9. The assembly of claim 1, wherein the reinforcement comprises material along a surface of the first component to thereby define a walled off area along the surface of the first component that generally surrounds the thermal interface material and confines the thermal interface material within the walled off area defined by the material; and wherein the thermal interface material does not protrude outwardly beyond the material defining the walled off area; and wherein the thermal interface material has a coefficient of thermal expansion higher than a coefficient of thermal expansion of the material defining the walled off area such that upon heating the thermal interface material expands outwardly beyond the material defining the walled off area, which thereby increases contact between the thermal interface material and the surface of the second component thereby resulting in a lower thermal resistance.

10. The assembly of claim 1, wherein the reinforcement comprises a channel formed along the first component and configured with a sufficient depth to entirely or substantially confine the thermal interface material within the channel.

11. A heat sink comprising the assembly of claim 1 and a protruding portion that protrudes outwardly from a surface of the heat sink, wherein:
the one or more strips of reinforcement material are along the protruding portion of the heat sink such that the one or more strips of reinforcement material define the area as a channel along the protruding portion of the heat sink; and
the thermal interface material is along the protruding portion of the heat sink within the channel defined generally between the one or more strips of reinforcement material.

12. The heat sink of claim 11, wherein:
the protruding portion of the heat sink comprises a pedestal;
the one or more strips of reinforcement material comprise first and second strips of reinforcement material applied respectively along opposing first and second longitudinal edges of the pedestal such that the first and second strips of reinforcement material define the channel along the pedestal generally between the first and second strips of reinforcement material; and
the thermal interface material is along the pedestal within the channel defined generally between the first and second strips of reinforcement material.

13. The heat sink of claim 12, wherein:
the pedestal protrudes outwardly from a surface of a first side of the heat sink, and the heat sink further comprises a plurality of fins protruding outwardly from a second side of the heat sink opposite the first side; and
the thermal interface material does not protrude outwardly beyond the first and second strips of reinforcement material except upon heating whereby the thermal interface material expands outwardly beyond the first and second strips of reinforcement material.

14. A device comprising the heat sink of claim 11 and a housing adapted to slidably receive a connector, wherein the thermal interface material is generally between the connector and the heat sink when the connector is received within the housing whereby the thermal interface material directly contacts the connector and defines at least a portion of a thermally-conductive heat path between the connector and the heat sink.

15. A device comprising the assembly of claim 1 and the first component, wherein:
the one or more strips of reinforcement material are along the first component that define a channel along the first component, and the thermal interface material is along the first component within the channel defined generally between the one or more portions of reinforcement material; and
the channel is configured with a sufficient depth to entirely or substantially confine the thermal interface material within the channel.

16. A device comprising the assembly of claim 1 and a housing adapted to slidably receive a connector, wherein the thermal interface material is generally between the connector and the housing when the connector is slidably received within the housing whereby the thermal interface material directly contacts the connector and defines at least a portion of a thermally-conductive heat path between the connector and the housing.

17. A method of reinforcing a thermal interface material for use between a first component and a second component slidable relative to the first component, the method comprising:
- providing reinforcement along the first component to thereby define an area along a surface of the first component; and
- thereafter providing the thermal interface material along the surface of the first component such that the thermal interface material is within the area defined by the reinforcement and a portion of the thermal interface material remains exposed for making contact with a surface of the second component, whereby the reinforcement provides abrasion resistance for the thermal interface material when the thermal interface material is slid relatively against the surface of the second component wherein the thermal interface material includes edges defining an outer perimeter of the thermal interface material, and the method includes providing the reinforcement along each said edge of the thermal interface material such that the reinforcement is along an entirety of the outer perimeter of the thermal interface material and thereby generally surrounds the thermal interface material, confines the thermal interface material within the area defined by the reinforcement, and inhibits migration of the thermal interface material from out of the area in all directions along the first component; wherein:
- the reinforcement comprises one or more strips of reinforcement material;
- the reinforcement has a height greater than a height of the thermal interface material relative to the surface of the first component along which the area is defined such that the thermal interface material does not protrude outwardly beyond the reinforcement; and
- the thermal interface material has a coefficient of thermal expansion higher than a coefficient of thermal expansion of the reinforcement, whereby upon heating the thermal interface material expands outwardly beyond the reinforcement, which increases contact with the surface of the second component thereby resulting in a lower thermal resistance.

18. The method of claim 17, wherein:
the thermal interface material is a first thermal interface material having a thermal conductivity of at least 1 W/mK, and providing the reinforcement comprises applying one or more wall portions of a second thermal interface material along the first component to thereby define the area along the first component generally between the one or more wall portions of the second thermal interface material, the second thermal interface material having a thermal conductivity of at least 1 W/mK; or
providing the reinforcement comprises building up a walled off area of material harder than the thermal interface material along a surface of the first component to thereby define the area along the first component generally between one or more walls of the walled off area of material; or
providing the reinforcement comprises forming a channel along the first component such that the channel has a depth to entirely or substantially confine the thermal interface material within the channel.

19. The method of claim 17, wherein:
providing the reinforcement comprises providing the one or more strips of reinforcement material along a protruding portion of a heat sink such that the one or more strips of reinforcement material define a channel along a surface of the protruding portion of the heat sink;
providing the thermal interface material comprises providing the thermal interface material along the protruding portion of the heat sink within the channel defined generally between the one or more strips of reinforcement material;
the one or more portions of reinforcement material have a height greater than a height of the thermal interface material relative to the surface of the protruding portion of the heat sink along which the channel is defined such that the thermal interface material does not protrude outwardly beyond the one or more strips of reinforcement material; and
the thermal interface material has a coefficient of thermal expansion higher than a coefficient of thermal expansion of the one or more strips of reinforcement material, whereby upon heating the thermal interface material expands outwardly beyond the one or more strips of reinforcement material, which thereby increases contact between the thermal interface material and the surface of the second component thereby resulting in a lower thermal resistance.

* * * * *